(12) United States Patent
Gu et al.

(10) Patent No.: US 6,934,921 B1
(45) Date of Patent: Aug. 23, 2005

(54) RESOLVING LBIST TIMING VIOLATIONS

(75) Inventors: Xinli Gu, Sunnyvale, CA (US); Sung Soo Chung, San Jose, CA (US); Frank Tsang, Fremont, CA (US)

(73) Assignee: Cisco Technology, Inc., San Jose, CA (US)

(*) Notice: Subject to any disclaimer, the term of this patent is extended or adjusted under 35 U.S.C. 154(b) by 651 days.

(21) Appl. No.: 10/041,109

(22) Filed: Jan. 4, 2002

(51) Int. Cl.[7] .......................... G06F 17/50; G01R 31/28
(52) U.S. Cl. .......................................... 716/6; 714/733
(58) Field of Search ........................ 716/6, 5; 714/733

(56) References Cited

U.S. PATENT DOCUMENTS 5,912,901 A   6/1999   Adams et al. ............. 371/22.5

OTHER PUBLICATIONS

J. Koehl et al., A Flat, Timing-Driven Design System for a High-Performance CMOS Processor Chipset, Proceedings of the Conference on Design, Automation and Test in Europe, pp. 312-320, Feb. 1998.*
M. Cogswell et al., Test Structure Verification of Logical BIST: Problems and Solutions, Proceedings of the ITC International Test Conference, pp. 123-130, Oct. 2000.*
Gu et al., "A Fast Timing Closure Technique for Industrial Use of Logic BIST", May 2001, pp. 1-10.
Hetherington et al., "Logic BIST for Large Industrial Designs: Real Issues and Case Studies", ITC International Test Conference, 1999, pp. 358-367.
Nakao et al., "Low Overhead Test Point Insertion for Scan-Based BIST", 1999, pp. 348-357.
Cheng et al., "Timing-Driven Test Point Insertion for Full-Scan and Partial-Scan BIST", 1995, pp. 506-514.

* cited by examiner

Primary Examiner—A. M. Thompson
(74) Attorney, Agent, or Firm—Thelen Reid & Priest LLP; David B. Ritchie

(57) ABSTRACT

Resolving timing violations introduced by a logic built-in self test (LBIST) sub-circuit formed within an underlying integrated circuit includes analyzing a circuit path-list corresponding to the integrated circuit for timing violations and generating a circuit timing violations analysis output; generating a first LBIST/circuit path-list based on the circuit path-list and an LBIST path-list corresponding to the LBIST sub-circuit; analyzing the first LBIST/circuit path-list for timing violations and generating an LBIST/circuit timing violations analysis output; comparing the LBIST/circuit timing violations analysis output with the circuit timing violations analysis output; generating an LBIST/circuit constraint file based on the comparison and predetermined protocols; and generating a second LBIST/circuit path-list based on the circuit path-list, the LBIST path-list and the constraints file. In this way, timing problems are quickly and efficiently resolved.

91 Claims, 3 Drawing Sheets

RESOLVING LBIST TIMING VIOLATIONS

FIELD OF THE INVENTION

The present invention is generally directed to the testing of integrated circuits. More particularly, the present invention is directed to the testing of integrated circuits using logic built-in self test.

BACKGROUND OF THE INVENTION

Testing of integrated circuits has long been known in the art. Presently, testing techniques are in widespread use for nearly all types of integrated circuits ranging from those implemented in household toys and appliances to sophisticated supercomputers. As a result, the testing of integrated circuits forms an important part of the manufacturing process for most integrated circuits in use today.

These testing techniques have been developed in a wide variety of electronic manufacturing and circuit design configurations, depending upon the intended need at the implementation site. One form of testing of integrated circuits in use today is known as Logic Built-In Self Test (LBIST). Generally, LBIST is a technique that is used to test an integrated circuit such as an Application Specific Integrated Circuit (ASIC) by a test logic sub-circuit that is built into an overall circuit design. In LBIST, test vectors are generated by a Pseudo-Random Pattern Generator (PRPG), such as the LBIST Architect tool from Mentor Graphics of Wilsonville, Oreg., on an integrated circuit and the responses from the ASIC are compressed by a Multiple Input Shift Register (MISR) to form a "signature". The signature in the MISR will then be compared with a predetermined signature generally referred to as a "golden signature" to determine if there are any defects in the ASIC.

This technique has the benefits of: 1) improving test quality by performing at-speed testing; 2) reducing manufacturing test costs by reducing tester usage time, tester memory requirements and the required number of tester input/output connections; and 3) reducing system test, diagnosis and repair costs by performing ASIC testing on board the ASIC. The technique, however, also has several disadvantages, including: 1) design hardware overhead due to the test logic inserted into the ASIC; and 2) extra design efforts due to the design complexity introduced. While the design hardware overhead is often negligible compared to design sizes and the silicon technologies used today, the extra design effort poses a significant obstacle to the implementation and usage of LBIST techniques.

Generally, one of the most significant obstacles in LBIST design is timing closure, arising from timing violations introduced by inserting the LBIST circuitry into the ASIC. The main timing violations introduced by LBIST are due to: 1) test point insertions; 2) x-bounding logic insertions; and 3) multi-cycle paths.

The test point insertion timing violations result when test points are inserted into circuit paths, such as for control and observation purposes. Due to the use of the pseudo-random pattern generator, random resistant logic in a design can be very difficult to test, making high test coverage technically and economically impractical. As stated above, these test point insertions can introduce functional path timing violations.

The second type of timing violation in LBIST design is caused by x-bounding logic. The nature of signature compression using a MISR requires that no unknown "X" values should be propagated into the MISR, otherwise the signature will be corrupted. Generally, "X" values are introduced by floating nets in a design, latches, non scannable flip-flops, external inputs which are not controlled on a tester (such as Credence QUARTET and Credence DUO available from Credence Systems Corporation of Fremont, Calif., and Teradyne J750 and Teradyne Catalyst 400 available from Teradyne, Inc. of Boston, Mass.) or system board, memories which are treated as black boxes and buses where contentions could happen. The x-bounding logic is used to block the "X" value propagation, however, the x-bounding logic could adversely affect design timing and, in many designs, timing budgets for memory accesses and I/O are often very tight.

Another type of timing violation in LBIST design is related to design false paths and multi-cycle paths. In functional mode, the switch of timing analysis for these paths is turned off. In other words, even though there are timing violations in these paths, they are ignored during the functional mode timing analysis. In test mode, however, all paths in the design need to be tested, and therefore their timing should be considered. In normal scan design, this is generally not a significant problem because the test clock frequencies are very slow. In LBIST design however, the test clock frequencies are at or close to the functional clock frequencies of the integrated circuit and can therefor cause timing violations.

A practical issue in LBIST design is the fault coverage that can be achieved. Fault coverage is often limited due to the pseudo-random test vectors used. Currently, several approaches have been used to alleviate this situation. One approach is to insert more test points to achieve full testability. As described above, test point insertion can affect design timing. Another approach is to increase the number of pseudo-random vectors to be used. This approach, however is limited to situations when the tester cost is not an issue. In many cases, however, tester cost is of significant concern. Thus, using current techniques, a trade-off must be made in order to achieve optimal results with limited resources.

Presently, the foregoing practical issues have not been fully addressed in the existing art. One current approach is to minimize the number of test points to be inserted in order to reduce the number of timing violations caused by test points. A disadvantage of this approach is that there is no guarantee that all of the timing violations caused by test points will be resolved.

Another existing approach addresses the x-bounding timing violations by suppressing the clock to avoid capturing "X" values that will propagate into the MISR. Unfortunately, adding logic to clock trees to suppress capturing will increase clock tree skew. Yet another approach attempts to provide a solution to multi-cycle path timing problems, based on a list of multi-cycle paths and the information on the number of cycles for each multi-cycle path to disable the capturing of "X" values. Under this approach, by suppressing the capture of a transmitting flip-flop, the transmitting flip-flop holds its previous state for an extra number of cycles to allow the receiving flip-flop to capture data safely. When the transmitting flip-flop performs the capture, the capture of the receiving flip-flop will be suppressed so that there is no potential for a hold-time violation. Although this approach can achieve full coverage of a circuit, it is not without its shortcomings. First, the multiplexer added in the front of the transmitting flip-flops could cause its own timing problems. Second, as a practical matter it is very hard to obtain the multi-cycle paths and their multi-cycle number information. In many cases, ASIC designers use a very simplified approach to specify the paths that can be ignored by for example setting all paths from a clock domain A to a clock domain B to false paths. Under this approach, however, it is very hard to obtain the multi-cycle paths and their multi-cycle number information because of the generally large number of specified paths involved. In addition, prior to manufacturing a circuit, circuit layout mapping processes, such as Place and Route processes, are generally used to determine the efficient positioning and connection paths of circuit components. These processes can also introduce additional timing violations that cause an undesirable signature mismatch between the signature in the MISR and the golden signature.

The present invention introduces a technique based on timing analyses to resolve timing problems efficiently so that extra design efforts introduced by using LBIST can be reduced or eliminated.

SUMMARY OF THE INVENTION

A method and apparatus for resolving timing violations introduced by a logic built-in self test (LBIST) sub-circuit formed within an underlying integrated circuit includes analyzing a circuit path-list corresponding to the integrated circuit for timing violations and generating a circuit timing violations analysis output; generating a first LBIST/circuit path-list based on the circuit path-list and an LBIST path-list corresponding to the LBIST sub-circuit; analyzing the first LBIST/circuit path-list for timing violations and generating an LBIST/circuit timing violations analysis output; comparing the LBIST/circuit timing violations analysis output with the circuit timing violations analysis output; generating an LBIST/circuit constraint file based on the comparison and predetermined protocols; and generating a second LBIST/circuit path-list based on the circuit path-list, the LBIST path-list and the constraints file.

BRIEF DESCRIPTION OF THE DRAWINGS

The accompanying drawings, which are incorporated into and constitute a part of this specification, illustrate one or more exemplary embodiments of the invention, and together with the detailed description, serve to explain the principles and exemplary implementations of the invention.

In the drawings.

DETAILED DESCRIPTION OF THE INVENTION

Various exemplary embodiments of the present invention are described herein in the context of resolving timing violations introduced by LBIST. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Referring now more particularly to the Drawings, the present invention is directed to resolving timing violations introduced by a logic built-in self test (LBIST) sub-circuit formed within an underlying integrated circuit.

Figure 1:
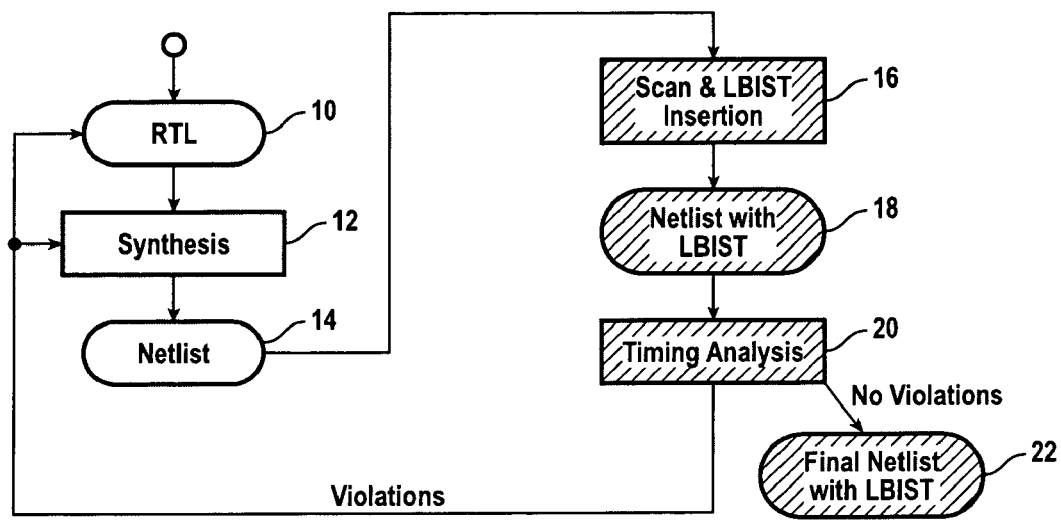
FIG. 1 is a prior art LBIST design flow diagram.

FIG. 1 illustrates a prior art LBIST design flow diagram, with the LBIST-related portions illustrated in shaded blocks. As shown, the flow begins at block 10 containing a conventional Register Transfer Logic (RTL) netlist, which is then forwarded to and received by block 12 where it undergoes conventional synthesis for generation of a gate level netlist in output block 14. Process then flows to the LBIST-related block 16 where a conventional scan & LBIST insertion is performed on the netlist to create the netlist with LBIST in output block 18. Next, at block 20, a conventional timing analysis is performed on the netlist with LBIST. This timing analysis generally includes two timing analyses: one in a functional mode and one in an LBIST mode. If the analysis in either mode shows a timing violation, then the process flow proceeds in a feedback path to block 12 at which point synthesis constraints are modified, thereafter the flow continues back to block 20 for further timing analysis as described above. If a timing violation still exists, the flow is returned back to block 12 at which point synthesis constraints are further modified. It may also be necessary for the flow to proceed in a feedback path to block 10 for modification to the RTL design. If modifications of either synthesis constraint or RTL design result in no timing violations at the timing analysis performed in block 20, then the flow proceeds to the output of a final netlist with LBIST in block 22. One shortcoming of this prior art approach is that often many iterations are needed to resolve the timing violations, resulting in expenditure of additional efforts, time-delays and other expenses associated with processing a number of iterations through the feedback flow and the subsequent modifications that are often required to resolve all timing violations for the netlist with LBIST in block 18. In addition, neither the modifying of synthesis constraints or the RTL design can guarantee the resolution of all of the timing violations. As explained below in greater detail, the present invention introduces a fast timing closure technique to quickly resolve timing violations associated with LBIST, to reduce or eliminate the foregoing problems.

Figure 2:
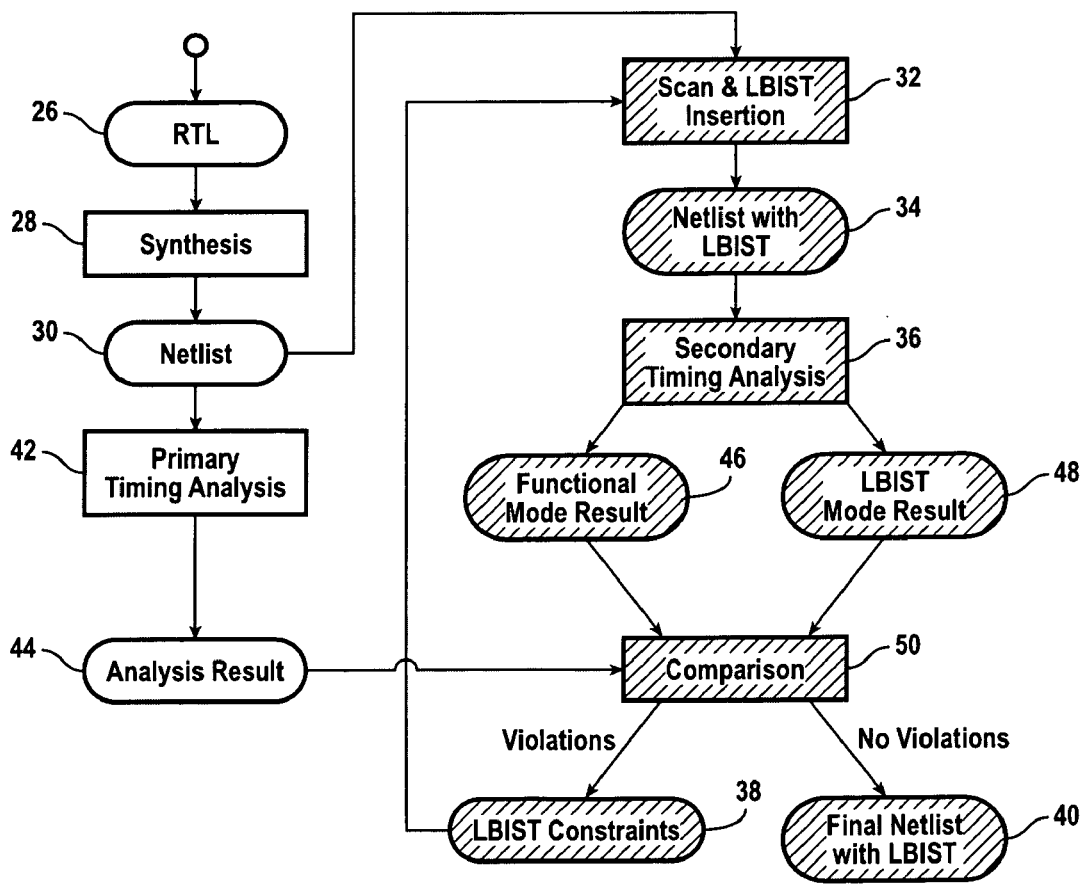
FIG. 2 illustrates an LBIST design flow diagram in accordance with one embodiment of the present invention.

FIG. 2 illustrates a design flow diagram in accordance with one embodiment of the present invention, where the shaded portions are LBIST related. As before, an RTL 26 is processed for synthesis at block 28 resulting in a netlist at block 30. Once the gate level netlist at block 30 is ready, it is output to and received by block 42 where a primary timing analysis is performed on the netlist (such as by using the PrimeTime tool from Synopsys, Inc. of Mountain View, Calif.), the results of which are output to block 44. The timing analysis results of block 44 will be later used to separate timing violations introduced by LBIST insertion from the violations that exist in the original netlist. In parallel with the primary timing analysis of block 42, the netlist is also passed to block 32 where scan and LBIST insertion are performed on the received netlist to generate a netlist with LBIST for output to block 34, with no LBIST constraints during this initial LBIST insertion. Next, in block 36 a secondary timing analysis is performed (such as by using the PrimeTime tool) on the received netlist with LBIST from block 34. The secondary timing analysis in block 36 generally includes two timing analyses: one in a functional mode and one in an LBIST mode, the results of which are then output to block 46 and block 48, respectively.

Next, in comparison block 50, the results of primary timing analysis from blocks 44 and secondary timing analysis 46 and 48 are compared to determine the existence of any timing violations. In an exemplary embodiment, the result of functional mode secondary timing analysis of block 46 is first compared with the primary timing analysis results of block 44 to determine the existence of a first predetermined set of timing violations such as control-point timing violations, observe-point timing violations and x-bounding timing violations. A second comparison of LBIST secondary timing analysis of block 48 is also compared with the functional mode timing analysis results of block 46 to determine the existence of a second predetermined set of timing violations such as multi-cycle timing violations and false-path timing violations.

If no timing violation is detected in either comparison performed in comparison block 50, then the flow proceeds to block 40 where a final netlist with LBIST is output. As explained below in greater detail, if a timing violation is detected in comparison block 50, then the results of both comparisons are then used to generate an LBIST insertion constraint file of block 38. The LBIST insertion constraint file of block 38, in turn, is used to guide a second scan and LBIST insertion once the flow returns to block 32. A second netlist with LBIST is then generated and output to block 34. As explained below in greater detail, this second LBISTed netlist will result in no timing violations for both functional mode analysis and LBIST mode analysis, provided that the initial netlist is free of timing violations. Otherwise, the remaining timing violations are those that exist in the original netlist. Once another secondary timing analysis is performed in block 36 and no timing violations are detected, the flow then proceeds to block 40 where a final netlist with LBIST is output.

One advantage of the foregoing feature over the prior art is that it guarantees timing closure for LBIST insertion without any iteration between synthesis of block 28 and the LBIST portions of shaded blocks 32–38. In addition, it also guarantees that at most only one iteration in the illustrated flow between block 32 and block 38 is required to resolve all timing violations due to LBIST insertion. In an exemplary embodiment of the present invention, once the second netlist with LBIST in block 32 is generated, the flow proceeds directly to block 40 in which a final netlist with LBIST is output.

The various features and operations of the invention will now be described in greater detail in conjunction with the following figures.

Figure 3:
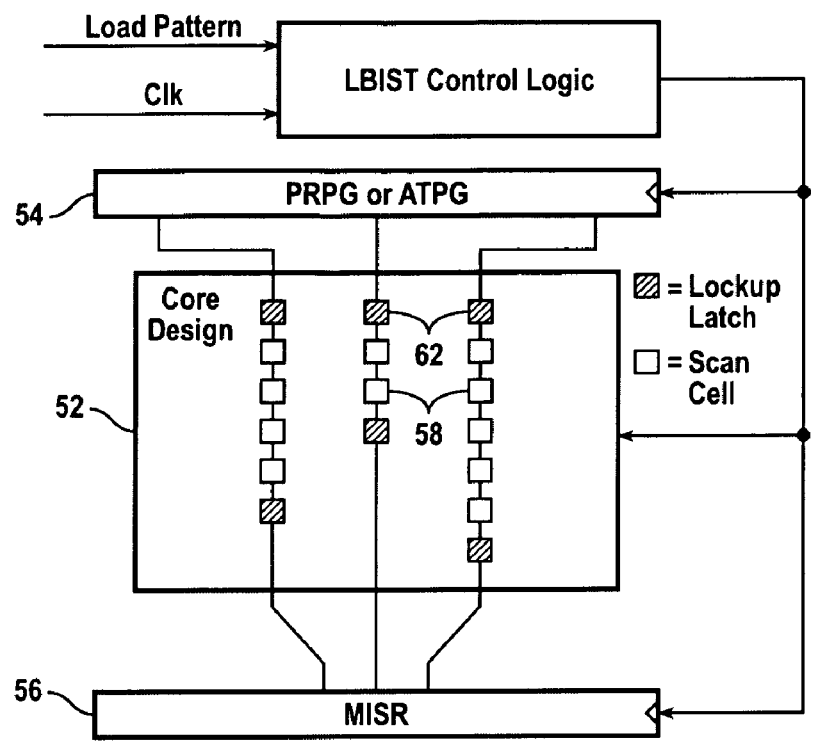
FIG. 3 is a block circuit diagram of LBIST architecture diagram in accordance with one embodiment of the present invention.

FIG. 3 is a block diagram of a typical LBIST circuit architecture. In the exemplary embodiment shown, the LBIST architecture is based on Self-Test Using MISR/Parallel SRSG (shift register sequence generator) or "STUMPS" for short. As shown, the scan chains 58 of the core design 52 form STUMPS channels that are fed by either pseudo-random patterns from a pseudo-random pattern generator (PRPG) unit, or fed by a deterministic automatic test pattern generator (ATPG), such as the Fastscan tool available from Mentor Graphics, through scan_input pins in unit 54. The captured responses of the scan cells in the STUMPS channels are compressed in the MISR 56. To minimize or eliminate timing problems at the boundaries of the core design 52, lockup-latches 62 are inserted at the beginning and at the end of the STUMPS channels.

Figure 4:
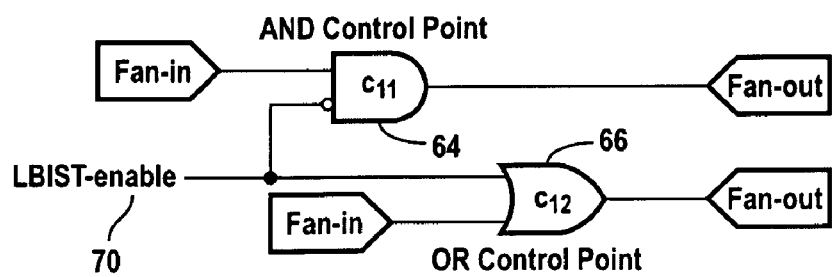
FIG. 4 is a circuit diagram of logic inserted for control points diagram in accordance with one embodiment of the present invention.

FIG. 4 illustrates an exemplary circuit diagram of logic inserted for control points. As shown control points can be of AND 64 or OR 66 type for control value "0" or control value "1".

Figure 5A:
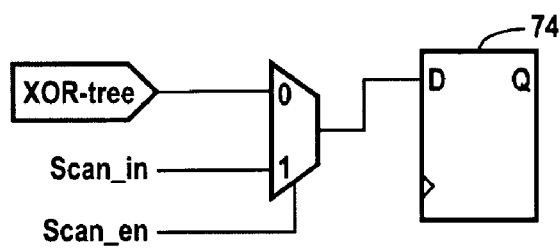
FIG. 5 is a circuit diagram of logic inserted for observe points diagram in accordance with one embodiment of the present invention.
Figure 5B:
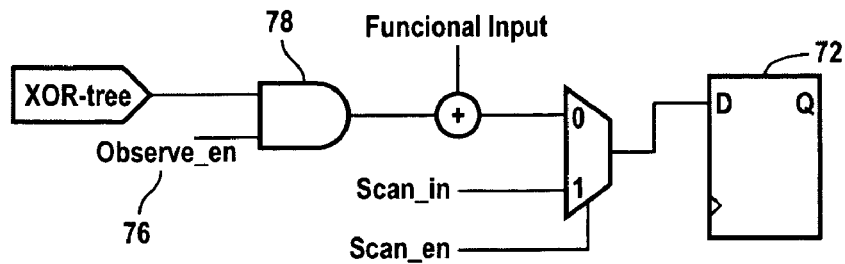

FIG. 5A and FIG. 5B illustrate an exemplary circuit diagram of logic inserted for observe points. In an exemplary embodiment as shown in FIG. 5A and FIG. 5B, two different types of logic are inserted for observation points to observe at flip-flops 74 and 72 respectively, where flip flop 74 is a dedicated flip-flop and flip-flop 72 is a functionally shared flip-flop. In the configuration of FIG. 5B, the observe enable signal is received by the observe-en line at the input port 76 of the AND gate, along with the XOR-tree input.

Figure 6:
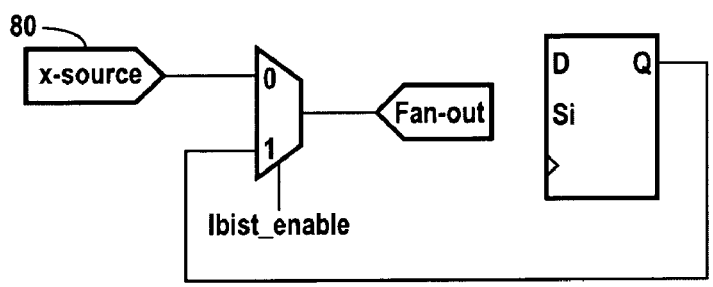
FIG. 6 is a circuit diagram for x-bounding logic diagram in accordance with one embodiment of the present invention.

FIG. 6 illustrates an exemplary circuit diagram for x-bounding logic using a multiplexer and an existing scan cell. Another important requirement for a successful design tested by using LBIST is that there can be no propagation of "X" values to scan cells in the STUMPS chains as shown in FIG. 3. If an "X" value is captured into a scan cell, it will corrupt the MISR signature. Therefore, in analyzing the core design, x-bounding logic is inserted to block any x-sources by gating off internal x-sources 80 via multiplexing in a new signal from an existing scan cell. Primary inputs are also considered x-sources, and they are always x-bounded by multiplexing in data from existing scan cells. One advantage of using the multiplexing technique is increased controllability. In an exemplary embodiment, the multiplexing technique is used for all internal x-sources as well.

Returning to FIG. 2, the details of the generation of the LBIST constraint file in block 38 will now be described in greater detail. As disclosed above, prior to reaching block 38, three timing analyses are carried out. The first timing analysis performed in block 42 (the primary timing analysis) is performed for the netlist before LBIST insertion. The second and third timing analyses are those performed in block 36 for the netlist after LBIST insertion, with one analysis performed in the functional mode and the other performed in the LBIST mode. This includes the mode change and timing analysis for paths including all false paths and multi-cycle paths. As explained above, the LBIST constraint file is obtained from the comparison of the three timing analysis reports performed in block 50.

Next, the specific locations in the integrated circuit responsible for causing the timing violations are identified in the LBIST constraint file 38. To better illustrate obtaining the LBIST constraint file 38 from the three timing analyses, and identifying the specific locations in the integrated circuit responsible for causing timing violations, a set of definitions have been provided below. The mathematical notations used therein and their attributed meaning are in conformity with well known mathematical notations used in the field.

Definition_1: A path P is a sequence of device instances $D_1, D_2, \ldots, D_n$ that are connected in the sequence; $P=D_1, D_2, \ldots, D_n$ where $D_1$ is a flip-flop, a memory output or external input, $D_n$ is a flip-flop, a memory input or external output, and others are combinational devices. The sequence order is denoted as $D_i \rightarrow D_j$ if $D_i$ is prior to $D_j$ in the sequence.

Definition_2: A test point TP is a device D that can be inserted into a path for testability purpose. A test point can be either a control point, an observe point or an X-bounding.

Definition_3: A test point $TP=D$ is on a path $P=D_1, D_2, \ldots, D_n$ if and only if $\exists i \in [1:n]: D = D_i$. denoted by $TP \in P$.

Definition_4: Given a path $P_1 = D_{11}, D_{12}, \ldots, D_{1n}$, path $P_2 = D_{21}, D_{22}, \ldots, D_{2(n+1)}$ is path $P_1$ with a test point $TP=D$ inserted if and only if $D_{1i} = D_{2i}, i \in [1,a], 1 \leq a \leq n, D_2(a+1)=D$, and $D_{1j} = D_2(j+1), j \in [a+1,n]$. This is denoted by $P_1 \subset P_2$. Otherwise, $P_2$ is not the same path as $P_1$ with a test point inserted, and it is denoted by $P_1 \not\subset P_1$ Path $P_1$ can have several test points inserted into it $P_1, P_2, \ldots, P_n$. This is also denoted by $P_1 \subset P_n$. This definition therefore determines whether two given paths are different from one another in a feature other than an inserted test point.

Definition_5: $P_{func}$ is a set of timing violation paths reported from timing analysis in functional mode for the netlist before LBIST insertion (i.e. netlist 30 of block 44).

Definition_6: $P_{lbist}$ is a set of timing violation paths reported from timing analysis in functional mode for the netlist after LBIST insertion (i.e. netlist 34 of block 46). Static test signals controlling LBIST operations are included in a false path list during timing analysis for the netlist after LBIST insertion. Therefore they should not appear in P lbist.

Definition_7: $P_{false}$ is a set of timing violation paths reported from timing analysis in LBIST mode after LBIST insertion (i.e. netlist 34 of block 48).

The LBIST constraint file 38 is generated in accordance with the following heuristics referencing the foregoing definitions:

Heuristic_1: $P_{lbist} - P_{func}$ is a set of functional timing violation paths caused by LBIST insertion:

$P_{lbist} - P_{func} = \{P | (P \in P_{lbist}) \wedge (\forall P_i \in P_{func}: (P_i \not\subset P) \wedge (P_i \neq P))\}$ $P_{lbist} - P_{func}$ is thus a subset of $P_{lbist}$ which contains the paths that are not in $P_{func}$ or the paths in $P_{func}$ with test points inserted. Therefore they are new timing violation paths after LBIST insertion.

In an exemplary embodiment, the paths from P func with test points inserted are not included in $P_{lbist} - P_{func}$, and their timing violations will not be considered from LBIST insertion point of view until functional timing violations are resolved. This however, could introduce an extra iteration of timing analysis. In addition, after resolving timing violations for the netlist of block 30, LBIST insertion in block 32 could cause another set of timing violations. One solution is to include the paths in P lbist–P func so that LBIST insertion will not insert test points into these paths, thus to make their timing violations only functional related. Thus $P_{lbist} - P_{func} = \{P | (P \in P_{lbist}) \wedge (\forall P_i \in P_{func}: P_i \neq P)\}$ Converting the timing violation paths caused by LBIST insertion to the LBIST constraint file of block 38, begins by identifying which control points, observe points and x-boundings inserted have caused timing violations. Assuming that $TP_{ctrl}$, $TP_{obs}$ and $TP_{xbnd}$ are a set of control points, observe points and x-boundings inserted in the initial LBIST insertion. following three heuristics are used to perform this conversion.

Heuristic_2: The set of control points that were initially inserted and cause timing violations can be identified by $TP_{ctrl}\_vio = \{TP | (TP \in TP_{ctrl}) \wedge (\exists P \in (P_{lbist} - P_{func}): TP \in P)\}$ Heuristic_3: The set of observe points that were initially inserted and cause timing violations can be identified by $TP_{obs}\_vio = \{TP | (TP \in TP_{obs}) \wedge (\exists P \in (P_{lbist} - P_{func}): TP \in P)\}$ Heuristic_4: The set of x-boundings that were initially inserted and cause timing violations can be identified by $TP_{obs}\_vio = \{TP | (TP \in TP_{obs}) \wedge (\exists P \in (P_{lbist} - P_{func}): TP \in P)\}$ $TP_{ctrl}\_vio$, $TP_{obs}\_vio$ and $TP_{xbnd}\_vio$ will be included in the LBIST insertion constraint file 38. The constrained LBIST insertion will use this information to ascertain that no timing violation is caused by the constrained LBIST insertion.

In an exemplary embodiment, timing violations in false paths or multi-cycle path, are all considered as multi-cycle path timing violations and can be identified by the following heuristic:

Heuristic_5: The set of timing violation multi-cycle paths in LBIST mode can be identified by $P_{false} - P_{lbist} = \{P | (P \in P_{false}) \wedge (\forall Pi \in P_{lbist}: Pi \neq P)\}$ $\{P_{false} - P_{lbist}\}$ will also be included in the LBIST insertion constraint file.

To resolve the timing violations caused by control and observe point insertions, those points that are identified by $TP_{ctrl}\_vio$ and $TP_{obs}\_vio$ are removed from the test point insertion list. Thus, the new control and observe points to be inserted in the constrained LBIST insertion (the second time insertion) are $\{TP_{ctrl} - TP_{ctrl}\_vio\}$ and $\{TP_{obs} - TP_{obs}\_vio\}$, respectively.

Figure 7:
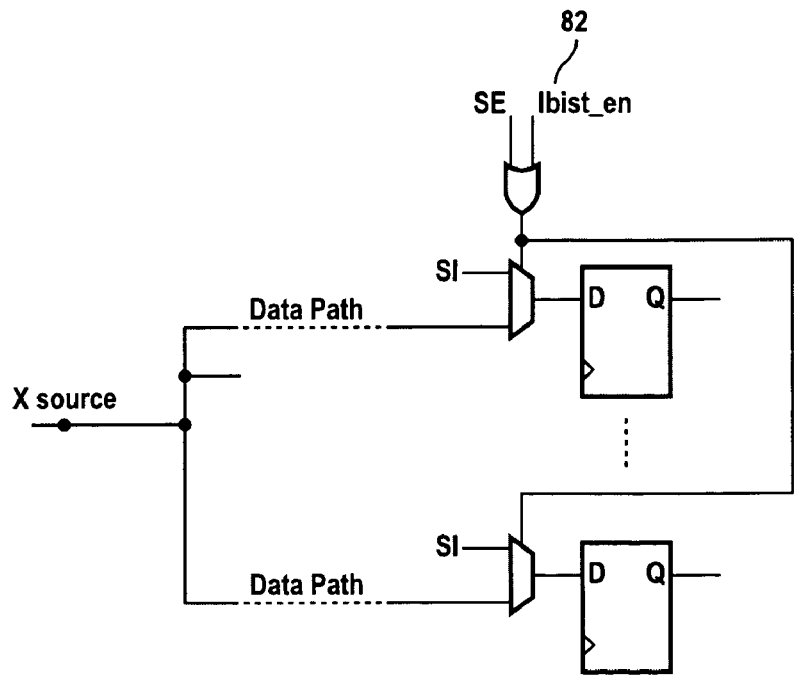
FIG. 7 is a circuit diagram illustrating the suppression for blocking "X" propagation diagram in accordance with one embodiment of the present invention.

For the inserted x-boundings that cause timing violations, these are first removed from the x-bounding list. The new x-bounding list thus becomes $\{TP_{xbnd} - TP_{xbnd}\_vio\}$, and timing violation problems are therefore resolved. The "X" values however, may propagate into scan flip-flops and later into the MISR. To block the "X" value propagations, substantially all flip-flops where an "X" value could be propagated into are identified. In an exemplary embodiment, this is performed by searching substantially all paths starting from the "X" source net. If the final device on the path is a flip-flop, its scan enable connection is then modified so that its capture is suppressed in LBIST mode. FIG. 7 is a circuit diagram illustrating this exemplary suppression approach for blocking "X" propagation. As shown, a suppression signal lbist_en 82 is received at the flipflop, marking the flip flop for suppression.

If the final device on the path is a memory input or an output, it is simply ignored since the "X" value will not be propagated to the MISR through a memory or an external output.

For timing violations in multi-cycle paths $\{P_{false} - P_{lbist}\}$, a similar method is used as in fixing x-bounding timing violations. First, the receiving flip-flops of all multi-cycle paths in $\{P_{false} - P_{lbist}\}$ are found and their capturing during LBIST mode is suppressed. This capture suppressing can avoid capturing unpredictable values due to the fact that the value propagation through these paths takes more than one clock cycle.

One advantage of the foregoing feature is that with the constrained LBIST insertion it is a practical guarantee that no timing violation for both functional mode and LBIST mode will exist in the LBIST inserted netlist of block 34 as shown in FIG. 2. The approach presented herein also minimizes the design efforts and possible schedule impact due to the introduction of LBIST. Since this approach is based on timing analysis to constrain the LBIST insertion, it practically guarantees that no iteration for re-synthesis occurs and only one iteration for timing analysis occurs.

It should be noted that the various features of the foregoing embodiments were discussed separately for clarity of description only and they can be incorporated in whole or in part into a single embodiment of the present invention having all or some these features. It should further be noted that the invention is not limited to ASICs but can readily used in conjunction with virtually any integrated circuit in which an LBIST testing approach is used.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for resolving timing violations introduced by a logic built-in self test (LBIST) sub-circuit formed within an underlying integrated circuit, said method comprising:
   analyzing a circuit path-list corresponding to said integrated circuit for timing violations and generating a primary timing violations analysis output;
   generating a first netlist with LBIST based on said circuit path-list and an LBIST path-list corresponding to said LBIST sub-circuit;
   analyzing said first netlist with LBIST for timing violations and generating a secondary timing violations analysis output;
   comparing said secondary timing violations analysis output with said primary timing violations analysis output;
   generating an LBIST insertion constraint file based on said comparing; and
   generating a second netlist with LBIST based on said circuit path-list, said LBIST path-list, and said constraints file wherein said timing violations introduced by said LBIST sub-circuit are resolved in said second netlist with LBIST.

2. A method in accordance with claim 1,
   wherein said circuit path-list includes a set of paths wherein each path in said set corresponds to a different route traversing a predetermined sequence of circuit components in said integrated circuit.

3. A method in accordance with claim 2,
   wherein said LBIST path-list includes a set of paths wherein each path in said set corresponds to a different route traversing a predetermined sequence of circuit components in said LBIST sub-circuit.

4. A method in accordance with claim 3, wherein said generating a first netlist with LBIST further comprises:
   generating a first scanned circuit path-list; and
   inserting said LBIST path-list into said first scanned circuit path-list to generate said first netlist with LBIST.

5. A method in accordance with claim 4, wherein said constraint file comprises of a set of said circuits in said LBIST path-list and a set of paths in said circuit path-list and wherein said generating a second netlist with LBIST further comprises:
   generating a second scanned circuit path-list;
   modifying paths in said second scanned circuit path-list based on said paths in said constraint file; and
   inserting said LBIST path-list into said second scanned circuit path-list based on said constraint file to generate said second netlist with LBIST wherein said circuits in said constraint file are excluded from said inserting into said scanned circuit path-list and said generated second netlist with LBIST.

6. A method in accordance with claim 5, wherein said predetermined sequence of circuit components comprising:
   a first circuit component wherein said first circuit component is the first traversed component in said path; and
   a second circuit component wherein said second circuit component is the last traversed component in said path.

7. A method in accordance with claim 6, wherein said first traversed component is a scan-enabled electronic flip-flop.

8. A method in accordance with claim 6, wherein said first traversed component is a memory output port.

9. A method in accordance with claim 6, wherein said first traversed component is an external input port.

10. A method in accordance with claim 6, wherein said last traversed component is a scan-enabled electronic flip-flop.

11. A method in accordance with claim 6, wherein said last traversed component is a memory input port.

12. A method in accordance with claim 6, wherein said last traversed component is an external output port.

13. A method in accordance with claim 6,
    wherein said analyzing said circuit path-list includes performing a functional mode timing violations analysis of said circuit path-list; and,
    wherein said generating a primary timing violation analysis output includes generating a circuit functional mode timing violations output path-list.

14. A method in accordance with claim 13, wherein said analyzing said first netlist with LBIST further comprises:
    analyzing said first netlist with LBIST for functional mode timing violations and generating a functional mode timing violations output path-list; and
    analyzing said first netlist with LBIST for an LBIST mode timing violations and generating an LBIST mode timing violations output path-list,
    wherein said generated secondary timing violations analysis output includes said functional mode timing violations output path-list and said LBIST mode timing violations output path-list.

15. A method in accordance with claim 14, wherein said comparing further comprises:
    comparing said functional mode timing violations output path-list with said primary timing violations analysis output path-list and generating a first comparison output path-list; and
    identifying in said first comparison output path-list a path with a circuit component causing timing violation, wherein said identifying is performed based on predetermined identification protocols.

16. A method in accordance with claim 15, wherein said comparing further comprises:
    separating each path in said functional mode timing violations output path-list exclusive from said primary timing violations analysis output path-list wherein said first comparison output includes said separated paths.

17. A method in accordance with claim 16, wherein said timing violation is a control point timing violation caused by a control point circuit.

18. A method in accordance with claim 17, said predetermined identification protocols comprising:
    comparing each path in said separated paths in said first comparison output path-list with a predetermined control-point-insertion database to identify said control-point timing violation circuits in said path, wherein said constraint file includes said identified control-point timing violation circuits in said path.

19. A method in accordance with claim 16, wherein said timing violation is an observe point timing violation caused by an observe point circuit.

20. A method in accordance with claim 19, said predetermined identification protocols comprising:
   comparing each path in said separated paths in said first comparison output path-list with a predetermined observe-point-insertion database to identify said observe-point timing violation circuits in said path,
   wherein said constraint file includes said identified observe-point timing violation circuits in said path.

21. A method in accordance with claim 16, wherein said timing violation is an x-bounding timing violation caused by an x-bounding circuit.

22. A method in accordance with claim 21, said predetermined identification protocols comprising:
   comparing each path in said separated paths in said first comparison output path-list with a predetermined x-bounding-insertion database to identify said x-bounding timing violation circuits in said path,
   wherein said constraint file includes said identified x-bounding timing violation circuits in said path.

23. A method in accordance with claim 22, wherein said modifying comprising:
   suppressing a capture of said last traversed scan-enabled electronic flip-flop in each said path.

24. A method in accordance with claim 22, further comprising:
   determining each path in said first netlist with LBIST whose first traversed circuit component is a first circuit component in said predetermined sequence of circuit components in each said separated path; and
   suppressing a capture of a last traversed scan-enabled electronic flip-flop in each of said determined paths.

25. A method in accordance with claim 14, wherein said comparing further comprises:
   comparing said LBIST mode timing violations output path-list with said functional mode timing violations output path-list and generating a second comparison output path-list; and
   identifying in said second comparison output path-list a path with a timing violation.

26. A method in accordance with claim 25, wherein said comparing further comprises:
   separating each path in said LBIST mode timing violations output path-list exclusive from said functional mode timing violations output path-list wherein said constraints file includes said separated paths.

27. A method in accordance with claim 26, wherein said timing violation is a multi-cycle-path violation.

28. A method in accordance with claim 26, wherein said timing violation is a false-path violation.

29. A method in accordance with claim 26, further comprising:
   suppressing a capture of a last traversed scan-enabled electronic flip-flop in said separated paths.

30. A method in accordance with claim 29, wherein said suppressed component is a receiving flip-flop.

31. A system for resolving timing violations introduced by a logic built-in self test (LBIST) sub-circuit formed within an underlying integrated circuit, said system comprising:
   means for analyzing a circuit path-list corresponding to said integrated circuit for timing violations and generating a primary timing violations analysis output;
   means for generating a first netlist with LBIST based on said circuit path-list and an LBIST path-list corresponding to said LBIST sub-circuit;
   means for analyzing said first netlist with LBIST for timing violations and generating secondary timing violations analysis output;
   means for comparing said secondary timing violations analysis output with said primary timing violations analysis output;
   means for generating an LBIST insertion constraint file based on said means for comparing; and
   means for generating a second netlist with LBIST based on said circuit path-list, said LBIST path-list, and said constraints file wherein said timing violations introduced by said LBIST sub-circuit are resolved in said second netlist with LBIST.

32. A system in accordance with claim 31,
   wherein said circuit path-list includes a set of paths wherein each path in said set corresponds to a different route traversing a predetermined sequence of circuit components in said integrated circuit.

33. A system in accordance with claim 32,
   wherein said LBIST path-list includes a set of paths wherein each path in said set corresponds to a different route traversing a predetermined sequence of circuit components in said LBIST sub-circuit.

34. A system in accordance with claim 33, wherein said means for generating a first netlist with LBIST further comprises:
   means for generating a first scanned circuit path-list; and
   means for inserting said LBIST path-list into said first scanned circuit path-list to generate said first netlist with LBIST.

35. A system in accordance with claim 34, wherein said constraint file comprises of a set of said circuits in said LBIST path-list and a set of paths in said circuit path-list and wherein said means for generating a second netlist with LBIST further comprises:
   means for generating a second scanned circuit path-list;
   means for modifying paths in said second scanned circuit path-list based on said paths in said constraint file; and
   means for inserting said LBIST path-list into said second scanned circuit path-list based on said constraint file to generate said second netlist with LBIST wherein said circuits in said constraint file are excluded from said inserting into said scanned circuit path-list and said generated second netlist with LBIST.

36. A system in accordance with claim 35, wherein said predetermined sequence of circuit components comprising:
   a first circuit component wherein said first circuit component is the first traversed component in said path; and
   a second circuit component wherein said second circuit component is the last traversed component in said path.

37. A system in accordance with claim 36, wherein said first traversed component is a scan-enabled electronic flip-flop.

38. A system in accordance with claim 36, wherein said first traversed component is a memory output port.

39. A system in accordance with claim 36, wherein said first traversed component is an external input port.

40. A system in accordance with claim 36, wherein said last traversed component is a scan-enabled electronic flip-flop.

41. A system in accordance with claim 36, wherein said last traversed component is a memory input port.

42. A system in accordance with claim 36, wherein said last traversed component is an external output port.

43. A system in accordance with claim 36,
wherein said means for analyzing said circuit path-list includes means for performing a functional mode timing violations analysis of said circuit path-list; and,
wherein said means for generating a primary timing violation analysis output includes means for generating a circuit functional mode timing violations output path-list.

44. A system in accordance with claim 43, wherein said means for analyzing said first netlist with LBIST further comprises:
means for analyzing said first netlist with LBIST for functional mode timing violations and generating a functional mode timing violations output path-list; and
means for analyzing said first netlist with LBIST for an LBIST mode timing violations and generating an LBIST mode timing violations output path-list,
wherein said generated secondary timing violations analysis output includes said functional mode timing violations output path-list and said LBIST mode timing violations output path-list.

45. A system in accordance with claim 44, wherein said means for comparing further comprises:
means for comparing said functional mode timing violations output path-list with said primary timing violations analysis output path-list and generating a first comparison output path-list; and
means for identifying in said first comparison output path-list a path with a circuit component causing timing violation, wherein said identifying is performed based on predetermined identification protocols.

46. A system in accordance with claim 45, wherein said means for comparing further comprises:
means for separating each path in said functional mode timing violations output path-list exclusive from said primary timing violations analysis output path-list wherein said first comparison output includes said separated paths.

47. A system in accordance with claim 46, wherein said timing violation is a control point timing violation caused by a control point circuit.

48. A system in accordance with claim 47, said predetermined identification protocols comprising:
a protocol for comparing each path in said separated paths in said first comparison output path-list with a predetermined control-point-insertion database to identify said control-point timing violation circuits in said path,
wherein said constraint file includes said identified control-point timing violation circuits in said path.

49. A system in accordance with claim 46, wherein said timing violation is an observe point timing violation caused by an observe point circuit.

50. A system in accordance with claim 49, said predetermined identification protocols comprising:
a protocol for comparing each path in said separated paths in said first comparison output path-list with a predetermined observe-point-insertion database to identify said observe-point timing violation circuits in said path,
wherein said constraint file includes said identified observe-point timing violation circuits in said path.

51. A system in accordance with claim 46, wherein said timing violation is an x-bounding timing violation caused by an x-bounding circuit.

52. A system in accordance with claim 51, said predetermined identification protocols comprising:
a protocol for comparing each path in said separated paths in said first comparison output path-list with a predetermined x-bounding-insertion database to identify said x-bounding timing violation circuits in said path,
wherein said constraint file includes said identified x-bounding timing violation circuits in said path.

53. A system in accordance with claim 52, wherein said means for modifying comprising:
means for suppressing a capture of said last traversed scan-enabled electronic flip-flop in each said path.

54. A system in accordance with claim 52, further comprising:
means for determining each path in said first netlist with LBIST whose first traversed circuit component is a first circuit component in said predetermined sequence of circuit components in each said separated path; and
means for suppressing a capture of a last traversed scan-enabled electronic flip-flop in each of said determined paths.

55. A system in accordance with claim 44, wherein said means for comparing further comprises:
means for comparing said LBIST mode timing violations output path-list with said functional mode timing violations output path-list and generating a second comparison output path-list; and
means for identifying in said second comparison output path-list a path with a timing violation.

56. A system in accordance with claim 55, wherein said means for comparing further comprises:
means for separating each path in said LBIST mode timing violations output path-list exclusive from said functional mode timing violations output path-list wherein said constraints file includes said separated paths.

57. A system in accordance with claim 56, wherein said timing violation is a multi-cycle-path violation.

58. A system in accordance with claim 56, wherein said timing violation is a false-path violation.

59. A system in accordance with claim 56, further comprising:
means for suppressing a capture of a last traversed scan-enabled electronic flip-flop in said separated paths.

60. A system in accordance with claim 59, wherein said suppressed component is a receiving flip-flop.

61. A system for resolving timing violations introduced by a logic built-in self test (LBIST) sub-circuit formed within an underlying integrated circuit, said system comprising:
a first analyzer subsystem adapted to receive and analyze a circuit path-list corresponding to said integrated circuit for timing violations and generate a primary timing violations analysis output;
a first path-list generator subsystem in operative electrical communication with said first analyzer subsystem and adapted to generate a first netlist with LBIST based on said circuit path-list and an LBIST path-list corresponding to said LBIST sub-circuit;
an second analyzer subsystem in operative electrical communication with said first path-list generator subsystem and adapted to receive and analyze said first netlist with LBIST for timing violations and generating secondary timing violations analysis output;
a comparator subsystem in operative electrical communication with said second analyzer subsystem and said first analyzer subsystem, and adapted to receive and to compare said secondary timing violations analysis output with said primary timing violations analysis output, and to output a comparison result;
a second path-list generator subsystem in operative electrical communication with said comparator subsystem and adapted to generate an LBIST insertion constraint file based on said comparison result; and a third path-list generator subsystem in operative electrical communication with said second path-list generator subsystem and adapted to generate a second netlist with LBIST based on said circuit path-list, said LBIST path-list, and said constraints file wherein said timing violations introduced by said LBIST sub-circuit are resolved in said second netlist with LBIST.

62. A system in accordance with claim 61,
wherein said circuit path-list includes a set of paths wherein each path in said set corresponds to a different route traversing a predetermined sequence of circuit components in said integrated circuit.

63. A system in accordance with claim 61,
wherein said LBIST circuit path-list includes a set of paths wherein each path in said set corresponds to a different route traversing a predetermined sequence of circuit components in said LBIST sub-circuit.

64. A system in accordance with claim 63, wherein said first path-list generator subsystem further comprises:
a fourth generator subsystem adapted to generate a first scanned circuit path-list; and
a first insertion subsystem adapted to insert said LBIST path-list into said first scanned circuit path-list to generate said first netlist with LBIST.

65. A system in accordance with claim 64, wherein said constraint file comprises of a set of said circuits in said LBIST path-list and a set of paths in said circuit path-list and wherein said third path-list generator subsystem further comprises:
a fifth generator subsystem adapted to generate a second scanned circuit path-list;
a modifier subsystem adapted to modify paths in said second scanned circuit path-list based on said paths in said constraint file; and
a second insertion subsystem adapted to insert said LBIST path-list into said second scanned circuit path-list based on said constraint file to generate said second netlist with LBIST wherein said circuits in said constraint file are excluded from said insertion into said scanned circuit path-list and said generated second netlist with LBIST.

66. A system in accordance with claim 65, wherein said predetermined sequence of circuit components comprising:
a first circuit component wherein said first circuit component is the first traversed component in said path; and
a second circuit component wherein said second circuit component is the last traversed component in said path.

67. A system in accordance with claim 66, wherein said first traversed component is a scan-enabled electronic flip-flop.

68. A system in accordance with claim 66, wherein said first traversed component is a memory output port.

69. A system in accordance with claim 66, wherein said first traversed component is an external input port.

70. A system in accordance with claim 66, wherein said last traversed component is a scan-enabled electronic flip-flop.

71. A system in accordance with claim 66, wherein said last traversed component is a memory input port.

72. A system in accordance with claim 66, wherein said last traversed component is an external output port.

73. A system in accordance with claim 66,
wherein said first analyzer subsystem is adapted to perform a functional mode timing violations analysis of said circuit path-list; and
wherein said generation of a primary timing violation analysis output includes generation of a circuit functional mode timing violations output path-list.

74. A system in accordance with claim 73, wherein said second analyzer subsystem further comprises:
a third analyzer subsystem adapted to analyze said first netlist with LBIST for functional mode timing violations and to generate a functional mode timing violations output path-list; and
a fourth analyzer subsystem adapted to analyze said first netlist with LBIST for an LBIST mode timing violations and to generate an LBIST mode timing violations output path-list,
wherein said generated secondary timing violations analysis output includes said functional mode timing violations output path-list and said LBIST mode timing violations output path-list.

75. A system in accordance with claim 74, wherein said comparator subsystem compares said functional mode timing violations output path-list with said primary timing violations analysis output path-list and generates a first comparison output path-list; and
wherein said comparator subsystem identifies in said first comparison output path-list a path with a circuit component causing timing violation, wherein said identification is performed based on predetermined identification protocols.

76. A system in accordance with claim 75, wherein said comparator subsystem further comprises:
a separator subsystem adapted to separate each path in said functional mode timing violations output path-list exclusive from said primary timing violations analysis output path-list wherein said first comparison output includes said separated paths.

77. A system in accordance with claim 76, wherein said timing violation is a control point timing violation caused by a control point circuit.

78. A system in accordance with claim 77, said predetermined identification protocols comprising:
a protocol to compare each path in said separated paths in said first comparison output path-list with a predetermined control-point-insertion database to identify said control-point timing violation circuits in said path,
wherein said constraint file includes said identified control-point timing violation circuits in said path.

79. A system in accordance with claim 76, wherein said timing violation is an observe point timing violation caused by an observe point circuit.

80. A system in accordance with claim 79, said predetermined identification protocols comprising:
a protocol to compare each path in said separated paths in said first comparison output path-list with a predetermined observe-point-insertion database to identify said observe-point timing violation circuits in said path,
wherein said constraint file includes said identified observe-point timing violation circuits in said path.

81. A system in accordance with claim 76, wherein said timing violation is an x-bounding timing violation caused by an x-bounding circuit.

82. A system in accordance with claim 81, said predetermined identification protocols comprising:
a protocol to compare each path in said separated paths in said first comparison output path-list with a predetermined x-bounding-insertion database to identify said x-bounding timing violation circuits in said path,
wherein said constraint file includes said identified x-bounding timing violation circuits in said path.

83. A system in accordance with claim 82, wherein said modifier subsystem comprising:
a suppression subsystem adapted to suppress a capture of said last traversed scan-enabled electronic flip-flop in each said path.

84. A system in accordance with claim 82, further comprising:
a determination subsystem adapted to determine each path in said first netlist with LBIST whose first traversed circuit component is a first circuit component in said predetermined sequence of circuit components in each said separated path; and
a suppression subsystem adapted to suppress a capture of a last traversed scan-enabled electronic flip-flop in each of said determined paths.

85. A system in accordance with claim 74, wherein said comparator subsystem compares said LBIST mode timing violations output path-list with said functional mode timing violations output path-list, generates a second comparison output path-list; and identifies in said second comparison output path-list a path with a timing violation.

86. A system in accordance with claim 85, wherein said comparator subsystem further comprises:
a separator subsystem adapted to separate each path in said LBIST mode timing violations output path-list exclusive from said functional mode timing violations output path-list wherein said constraints file includes said separated paths.

87. A system in accordance with claim 86, wherein said timing violation is a multi-cycle-path violation.

88. A system in accordance with claim 86, wherein said timing violation is a false-path violation.

89. A system in accordance with claim 86, further comprising:
a suppression subsystem adapted to suppress a capture of a last traversed scan-enabled electronic flip-flop in said separated paths.

90. A system in accordance with claim 89, wherein said suppressed component is a receiving flip-flop.

91. A program storage device readable by a machine, tangibly embodying a program of instructions executable by the machine to perform a method for resolving timing violations introduced by a logic built-in self test (LBIST) sub-circuit formed within an underlying integrated circuit, said method comprising:
analyzing a circuit path-list corresponding to said integrated circuit for timing violations and generating a primary timing violations analysis output;
generating a first netlist with LBIST based on said circuit path-list and an LBIST path-list corresponding to said LBIST sub-circuit;
analyzing said first netlist with LBIST for timing violations and generating secondary timing violations analysis output;
comparing said secondary timing violations analysis output with said primary timing violations analysis output;
generating an LBIST insertion constraint file based on said comparing; and
generating a second netlist with LBIST based on said circuit path-list, said LBIST path-list, and said constraints file wherein said timing violations introduced by said LBIST sub-circuit are resolved in said second netlist with LBIST.

* * * * *